United States Patent [19]
Yamazaki et al.

[11] Patent Number: 5,462,767
[45] Date of Patent: Oct. 31, 1995

[54] CVD OF CONFORMAL COATINGS OVER A DEPRESSION USING ALKYLMETAL PRECURSORS

[75] Inventors: Shunpei Yamazaki, Tokyo; Takashi Inujima, Kanagawa, both of Japan

[73] Assignee: Semiconductor Energy Laboratory Co., Ltd., Kanagawa, Japan

[21] Appl. No.: 139,864

[22] Filed: Oct. 22, 1993

Related U.S. Application Data

[60] Continuation of Ser. No. 928,058, Aug. 11, 1992, abandoned, which is a division of Ser. No. 663,044, Feb. 26, 1991, abandoned, which is a continuation of Ser. No. 311,402, Feb. 15, 1989, abandoned, which is a continuation-in-part of Ser. No. 137,567, Dec. 24, 1987, abandoned, which is a continuation-in-part of Ser. No. 909,203, Sep. 19, 1986, Pat. No. 4,735,821.

[30] Foreign Application Priority Data

Sep. 21, 1985 [JP] Japan .................................. 60-209597

[51] Int. Cl.⁶ .......................... C23C 16/00; H01L 21/306
[52] U.S. Cl. .................. 427/248.1; 427/250; 427/255.7; 427/419.1; 437/67; 437/919; 216/58; 216/79
[58] Field of Search ............................. 427/248.1, 255.1, 427/255.2, 255.3, 255.7, 309, 419.1, 419.2, 250; 437/67, 919, 238, 235; 156/653, 657, 662

[56] References Cited

U.S. PATENT DOCUMENTS 3,200,018  8/1965  Grossman .
3,772,098  11/1973  Tribes .

(List continued on next page.)

FOREIGN PATENT DOCUMENTS 58-67043    4/1983   Japan .
59-94829    5/1984   Japan .
59-200453  11/1984   Japan .
60-176251   9/1985   Japan .
61-54041    3/1986   Japan .

OTHER PUBLICATIONS

IBM Technical Disclosure Bulletin vol. 27 No. 11 Apr. 1985 "Dynamic RAM Cell with Merged Drain and Storage" pp. 6694–6697.

"VLSI Fabrication Principles–Silicon and Gallium Arsenide", Sorab K. Ghandi Rensselaer Polytechnic Institute–Scientific Library Pat & T.M. Office, 1983, pp. 582–585.

"Buried Storage Electrode (BSE) Cell for Megabit DRAMS", M. Sakamoto et al., VLSI Development Division, NEC Corporation, Japan pp. 710–713, 1985.

"A Deep–Trenched Capacitor Technology for 4 Mega Bit Dynamic RAM", K. Yamada et al. VLSI Research Center, Toshiba Corporation, Japan pp. 702–705, 1985.

"Photo–CVD for VLSI Isolation" John Yuan–tai & Richard C. Henderson; Hughes Research Laboratories, Malibu, Calif. 90265, pp. 2146–2151, 1984.

Wolf et al, "Silicon Processing for the VLSI Era", vol. 1: Process Technology, pp. 185–187, Lattice Process (California) 1986.

*Primary Examiner*—Roy V. King
*Attorney, Agent, or Firm*—Sixbey, Friedman, Leedom & Ferguson; Gerald J. Ferguson, Jr.

[57] ABSTRACT

A CVD method for forming a conformal coating over a depression or a cave in a top surface is disclosed, which comprises the steps of forming at least one depression or a cave in said top surface where at least a portion of the depression or the cave has an inner surface; providing a reactive precursor containing at least an alkyl metal compound; and CVD forming from a gas of said reactive precursor at least one metal-containing layer over said top surface and said depression or cave such that the ratio ds/dt of the thickness (ds) of the layer on the inner surafce of the depression or cave and the thickness (dt) of the layer on the top surface is substantially one.

17 Claims, 6 Drawing Sheets

U.S. PATENT DOCUMENTS

| | | |
|---|---|---|
| 4,017,885 | 4/1977 | Kendall et al. |
| 4,104,086 | 8/1978 | Bondur et al. |
| 4,137,100 | 1/1979 | Zaleckas |
| 4,140,558 | 2/1979 | Murphy et al. |
| 4,327,476 | 5/1982 | Iwai et al. |
| 4,343,657 | 8/1982 | Ito et al. |
| 4,371,587 | 2/1983 | Peters |
| 4,394,196 | 7/1983 | Iwai |
| 4,397,075 | 8/1983 | Fatula, Jr. et al. |
| 4,444,801 | 4/1984 | Hongo et al. |
| 4,466,992 | 8/1984 | Dreiling |
| 4,502,914 | 3/1985 | Trumpp et al. |
| 4,506,434 | 3/1985 | Ogawa et al. |
| 4,509,249 | 4/1985 | Goto et al. |
| 4,526,631 | 7/1985 | Silvestri et al. |
| 4,544,576 | 10/1985 | Chu et al. |
| 4,571,819 | 2/1986 | Rogers et al. |
| 4,577,395 | 3/1986 | Shibata |
| 4,580,331 | 4/1986 | Soclof |
| 4,588,610 | 5/1986 | Yamazaki |
| 4,624,736 | 11/1986 | Gee et al. |
| 4,645,564 | 2/1987 | Morie et al. |
| 4,662,064 | 5/1987 | Hsu et al. |
| 4,670,091 | 6/1987 | Thomas et al. |
| 4,685,198 | 8/1987 | Kawakita et al. |
| 4,690,729 | 9/1987 | Douglas |
| 4,695,479 | 9/1987 | Nakakura et al. |
| 4,702,795 | 10/1987 | Douglas |
| 4,708,767 | 11/1987 | Bril |
| 4,711,699 | 12/1987 | Amano |
| 4,724,159 | 2/1988 | Yamazaki |
| 4,735,821 | 4/1988 | Yamazaki et al. |
| 4,845,048 | 7/1989 | Tamaki et al. |
| 4,861,622 | 10/1989 | Yamazaki et al. |
| 4,872,947 | 10/1989 | Wang et al. |
| 5,079,615 | 1/1992 | Yamazaki et al. |
| 5,084,130 | 1/1992 | Yamazaki et al. |

INSIDE A REACTION CHAMBER

CVD OF CONFORMAL COATINGS OVER A DEPRESSION USING ALKYLMETAL PRECURSORS

REFERENCE TO RELATED APPLICATION

This application is a Continuation of Ser. No. 07/928,058, filed Aug. 11, 1992, now abandoned, of which the subject application was a Divisional application of Ser. No. 07/663,044, filed Feb. 26, 1991 (now abandoned), which is a continuation application of Ser. No. 07/311,402, filed Feb. 15, 1989 now abandoned, which is a CIP application of Ser. No. 07/137,567, filed Dec. 24, 1987 (now abandoned) which is a CIP of Ser. No. 06/909,203, filed Sep. 19, 1986, now U.S. Pat. No. 4,735,821.

BACKGROUND OF THE INVENTION

This invention relates to a capacitor for a semiconductor memory, and to a method in which a photo CVD process is carried out so that the deposition is effectively performed also on insides of depressions.

There is broadly known and used a low pressure CVD method, a plasma CVD method, and a chemical vapor deposition method for semiconductor processing. In the semiconductor processing method, depressions such as a hole, a trench, a cave (a sub-surface re-entrant opening having surfaces out of line-of-sight) or so on are configured on whose surfaces are placed a product created by the CVD method to form a buried field insulating layer or an electric element such as a capacitance in the depression, or to fill an over-etching region in the form of a depression. When a formation of a layer on the depression is desired, it is inevitable that the thickness "ds" of the layer on an inner surface (depression) and the thickness "dt" of the layer on an upper surface result in dt/ds >1. One of the problems of researching to obtain a finely configured semiconductor in the VLSI field is how an inverse ratio, namely ds/dt, can be increased near 1. Further, in the case where the depth of a cave has a measure more than the measure of the opening of the cave, it was impossible to form a uniform layer throughout the inside of the cave. Such caves are formed, e.g., with a known trench method which can dig a cave of depth having a measure 3 to 5 times as large as the measure of the width of the opening thereof. Anyhow, existing methods are not suitable to perform a deposition in such a cave.

Namely, according to an existing CVD method, atoms or molecules are deposited on a substrate in an excited condition which are diffused into vapor after being decomposed or after undergoing a reaction caused by thermal energy. The existing process can be performed effectively when it is carried out under negative pressure, since the active molecules have a relatively long mean free path in the vapor under a negative pressure, compared with that under the atmospheric pressure. For example, on a substrate with a trench of 2 micron meters in width and also in depth, a depression resulted in a layer 1 of micron meter thickness on the upper surface, a layer with at most a thickness of 0.7 micron meter on the side wall of the trench and a layer with the thickness of 0.6 micron meter on the bottom of the trench. In any case, a step coverage ds/dt is expected only up to about 0.7.

According to another known method, step coverages are no more than that of the above method. Normally, ds/dt= 0.3–0.5. A plasma enhanced CVD alone is comparable with the above LPCVD.

Another problem associated with the prior art is as follows. When a surface having depressions is coated with an overlying layer, the top surface of the overlying layer inevitably becomes uneven. Some troubles are caused by the uneven surface. For example, when a multi-level interconnection is produced with intervening insulating films for isolating constituent electrode arrangements on different levels (as illustrated in FIGS. 8(A)–8(E)), the electrode arrangement (or pattern) overlying an uneven surface of the intervening insulating film may not be connected to the electrode pattern beneath the intervening insulating film.

SUMMARY OF THE INVENTION

This application is directed to a capacitor which can be used for finely densed capacitances formed on a semiconductor memory, and to a method for coating the side surface of a trench other than its bottom. The opening of the coating on the bottom can be used for forming a capacitance, a transistor, or so forth.

The invention has been conceived on the basis of the discovery by the inventor of a phenomenon in which active atoms, (molecules) excited by irradiation with light can preserve their active energy, referred to hereafter as a first energy, for a relatively long time. The active energy of the atom partially remains after the atoms are laid on the substrate, the residual energy being referred to hereafter as the second energy.

While undergoing a CVD method, atoms with the first energy are overlying the atoms with the second energy which are already deposited. According to experiment by the Applicant, the overlying atoms can wander on the substrate so that the sum of the first energy and the second energy takes less value. The wandering atoms can reach a bare surface of the substrate on which they are stabilized. This means that it is possible to form a layer even on a hidden surface from a principal surface. Further, the phenomenon makes it possible that a layer can be formed according to a new formation theorem which is entirely different from the exciting theorem. According to experiments described in detail infra, the phenomenon appears as if material is poured into a trench, like liquid.

It is therefore an object of the invention to provide an improved CVD method capable of performing deposition on a depression region.

It is another object of the invention to provide an improved CVD method according to which a thick layer is formed even on a depression region.

It is further object of the invention to provide an improved CVD method according to which a deposition is established also in the inside of a deep cave.

It is a still further object of the invention to produce an improved capacitor for a semiconductor memory.

The above-discussed problem with respect to the uneven surface coated with an overlying layer is overcome, in accordance with the present invention, by isotropic etching of the uneven upper surface of the insulating film so that the upper surface on which overlying film is formed is made flat and smooth.

BRIEF DESCRIPTION OF THE DRAWINGS

FIGS. 7 (A), 7(B), 7(C) and 7 (D) are top elevational views of a substrate in which different caves are formed.

DETAILED DESCRIPTION OF THE PREFERRED EMBODIMENT

Figure 1:
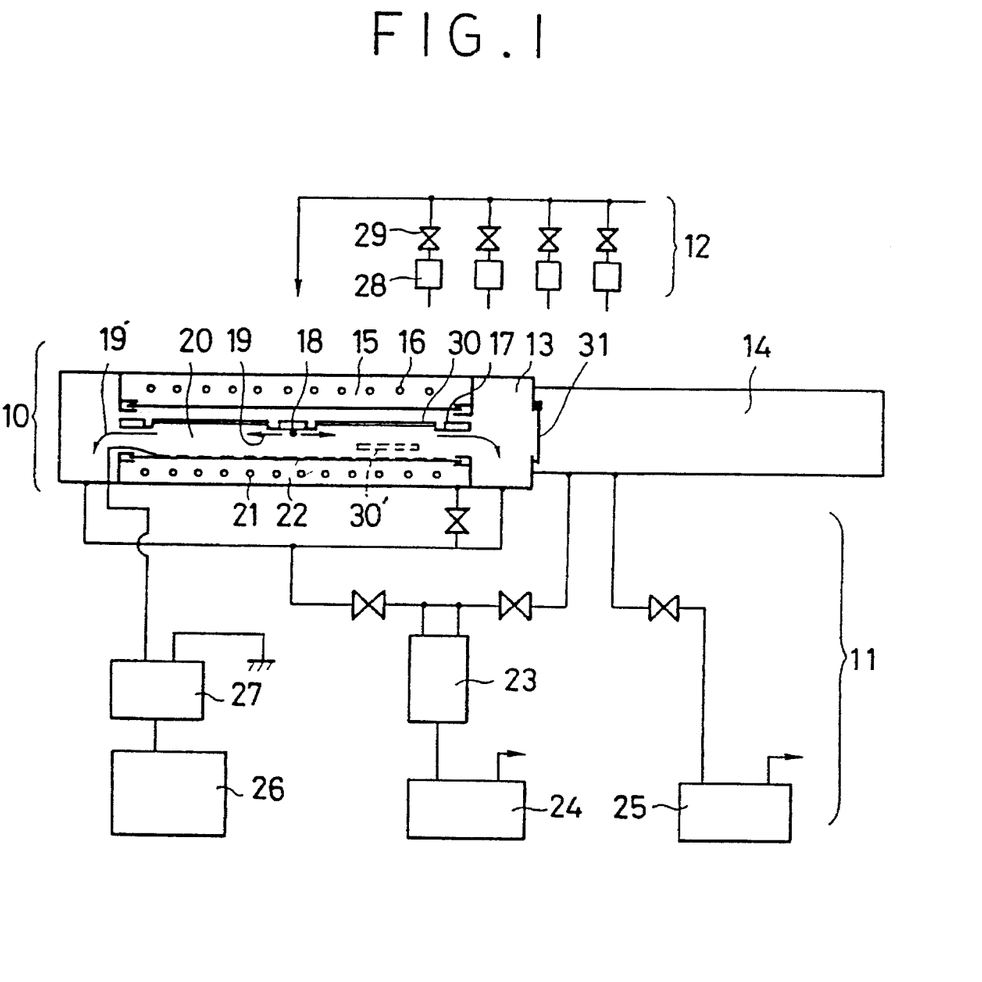
FIG. 1 is a schematic diagram showing a CVD device used in methods of the invention.

Referring to FIG. 1, an example of a CVD apparatus which is preferably used for the invention is shown. In the figure, a CVD device comprises a reaction system 10, an exhausting system 11 and a reactant gas supply system 12. The reaction system 10 includes a prechamber 14 and a reaction chamber 13, both being evacuated in advance of deposition. First, a plurality of substrates 30 are prepared on which a deposition will be carried out. The substrates are supported on the holder 17 so as to be arranged apart from each other. Then, the plurality of substrates are transferred to the reaction chamber 13 from the prechamber 14 together with the holder 17 through a gate valve 31. In the reaction chamber 13, the substrates 30 are irradiated with ultraviolet light of 184 nm or 254 nm wavelength from a low pressure mercury lamp 21 in a light source chamber 22. The substrate 30 is irradiated with light from the lower side of the substrate 30 and heated from the upper side by a halogen lamp heater 16 provided in a heating chamber 15.

Reactant gas is introduced to the reaction chamber 13 from a gas supply (not shown) via a flow rate meter 28, a valve 29 and a nozzle 18. In the reaction chamber 13, the gas constitutes flows designated with references 19 and 19' in which the gas is excited, made active and decomposed by the ultraviolet light emitted from the lamp 21, and a resultant product is deposited on the substrate 30 as a layer.

As reactant gases, a mixed gas of polysilane and polyfluorosilane is used for the silicon layer. In addition to this reactant gas, an amount of ammonia gas can be further mixed to make a silicon nitride layer. When a p-type or an n-type semiconductor layer is desired, a suitable impurity or impurities may be blended. Such reactive gas is introduced with a carrier gas, if necessary.

Further, the reactive gas for the silicon layer is mixed with oxide gas to form a silicon oxide layer, a phosphorous glass or a boron glass. Instead of a silicon layer, an alkylmetal can be introduced to form a metal layer, or an alkylmetal and a polysilane can be introduced to form a layer composed of a metal and a silicide.

Figure 2:
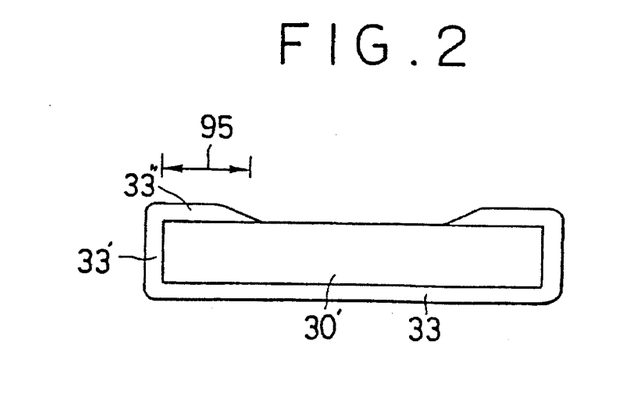
FIG. 2 is a section view of the semiconductor device formed in accordance with a first embodiment of the invention.

Referring now to FIG. 2, a section view of an experimental product formed by the above method is described to show a first embodiment of the invention. This product was fabricated using a monocrystalline silicon substrate 30' of 15 mm long×20 mm wide×380 micron meters thick. The substrate 30' was irradiated with ultraviolet light at 3 torr. Then, as shown in the figure, a silicon nitride layer 33 was formed on the substrate 30' with a thickness of 1000 Å on the bottom and also with a thickness of 1000 Å on the side wall. The noticeable result of the experiment is that the silicon nitride layer 33" was observed also on the upper surface as an extension 35 of 5 mm, whose thickness was measured of 1000 Å on the edge portion having 2 mm width from the side wall of the substrate 30'.

What is further of interest is that the wandering of the deposited materials seems to depend little on the temperature of the substrate 30'. A silicon nitride layer can be formed at a temperature less than 400° C. Needless to say, no layer is formed without irradiation even at about 300° C.

Figure 3A:
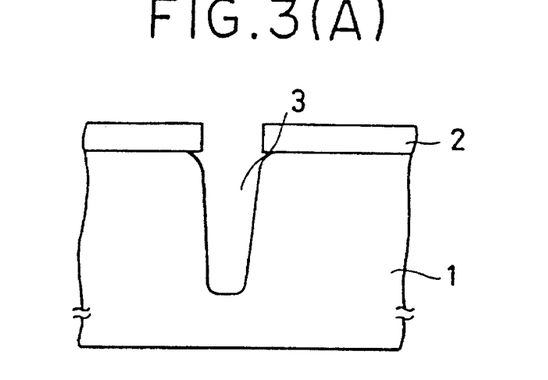
FIGS. 3(A), 3(B) and 3(c) are fragmentary section views showing a method for depositing a layer on a substrate in accordance with a second embodiment of the invention.
Figure 3B:
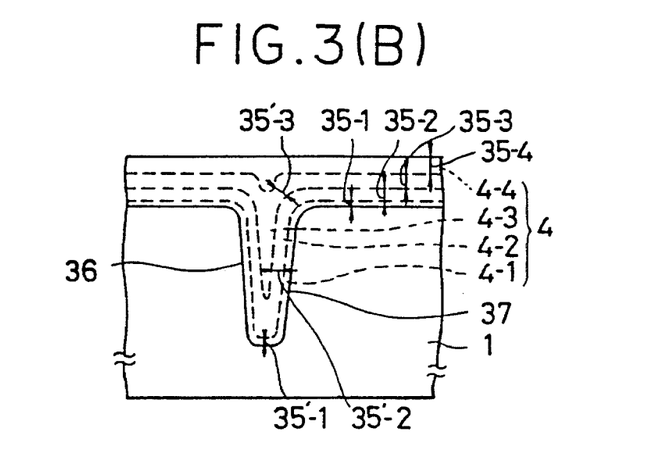
Figure 3C:
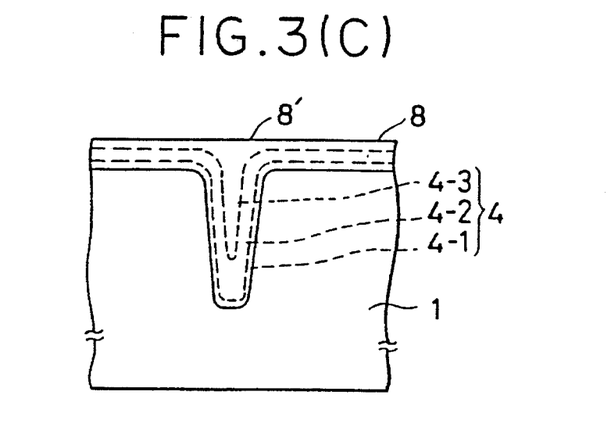

FIGS. 3(A) to 3(c) are fragmentary cross sectional views showing a second embodiment according to the invention. On a silicon semiconductor substrate 1 is a silicon nitride layer 2 which was etched to prepare an opening as a mask for a trench 3. The trench 3 was created by etching with the nitride layer 2 as a mask.

After removing the silicon nitride layer 2, a silicon oxide layer was deposited on the substrate 1 in accordance with the method explained above conjunction with FIG. 1. In FIG. 3(B), broken lines 4 are plotted to explain how the silicon nitride layer 36 was grown. The broken lines 4-1 to 4-4 show contours in sequence of the layer growing. The thickness of each layer deposited on each step 35-1 and 35-1', 35-2 and 35-2' . . . or 35-4 was observed to be uniform throughout the deposited surface including the inside of the trench 3.

Since the uppermost surface of the layer 3 just over the trench tends to be finished in the form of a concave, the upper portion of the layer may be removed by isotropic etching to level the surface as shown in FIG. 3(C).

Although this experiment was carried out to form a silicon oxide layer, other layers of silicide such as a silicon nitride layer can be formed according to a similar process, such as silicon nitride. Also, after completion of a layer different from a silicon oxide layer, the surface of the layer may be oxidized to form a surface of silicon oxide.

Contrary to existing technique, the CVD according to the invention is carried out at relatively low temperature (about 300° C.) since the bottom of a trench is likely to produce lattice defects therein at a high temperature. The layer thus formed, however, has a very fine structure comparable with a layer conventionally formed at higher than 1000° C.

Figure 4A:
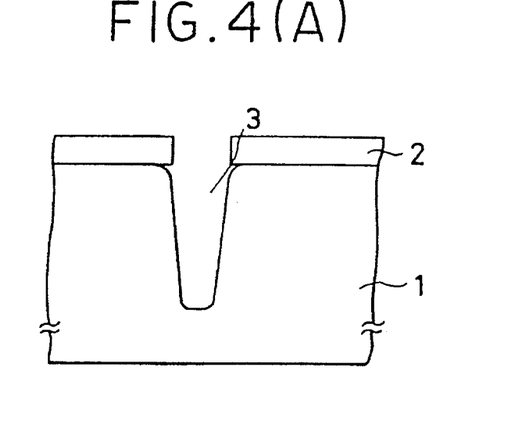
FIGS. 4(A), 4(B) and 4(c) are fragmentary section views showing a third embodiment of the invention.
Figure 4B:
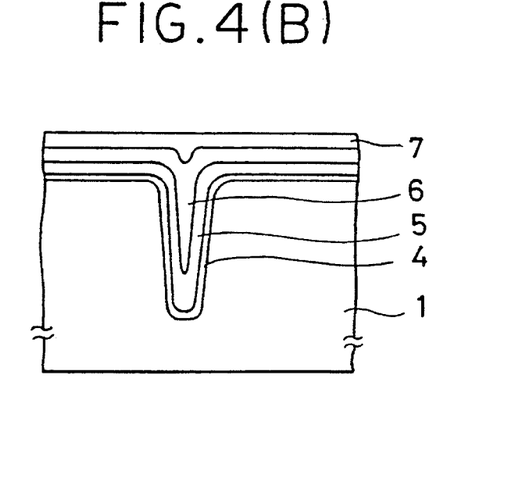
Figure 4C:
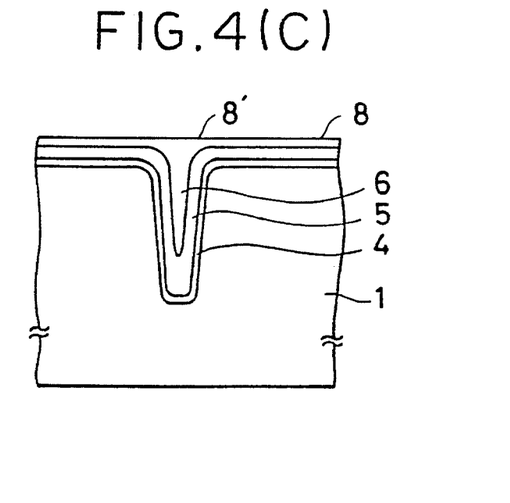

Referring to FIGS. 4(A) to 4(c), a third embodiment is shown. The embodiment includes an extrinsic semiconductor. The process is substantially identical to the preceding embodiment so that redundant descriptions will not be repeated. On a silicon semiconductor are a silicon oxide or a silicon nitride layer 4, a polysilicon or amorphous silicon layer 5 which is doped with phosphorus as which is an impurity or a metallic conductive layer 5 such as of titanium chloride or tungsten, and a silicon oxide layer 6. In this configuration, a capacitance is constituted between the semiconductor substrate 1 and the conductive layer 6.

Figure 5A:
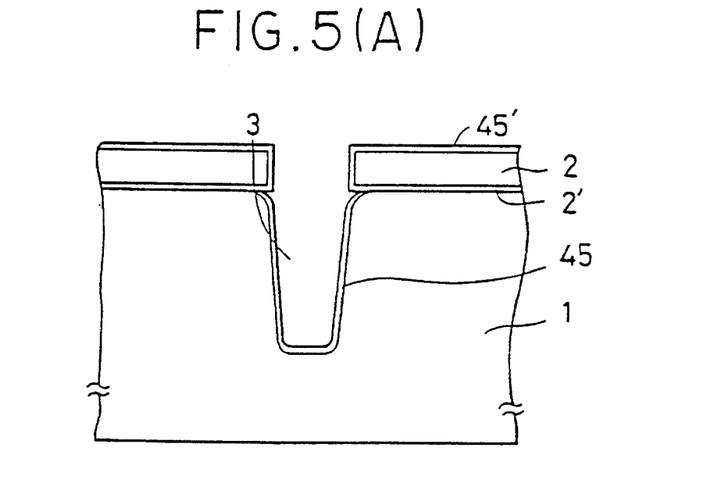
FIGS. 5(A), 5(B) and 5(C) are fragmentary section views showing a fourth embodiment of the invention.
Figure 5B:
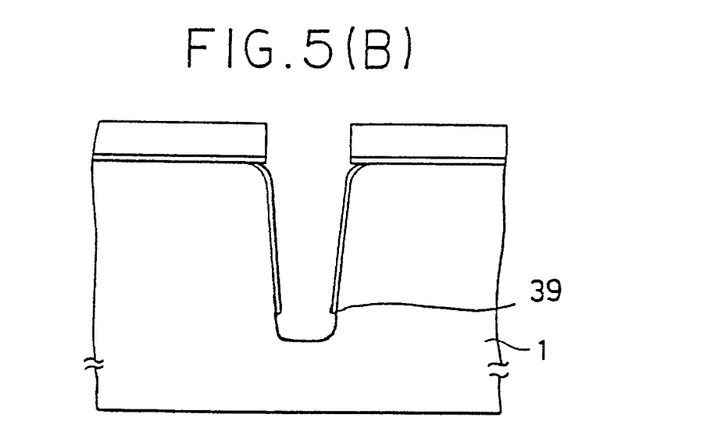
Figure 5C:
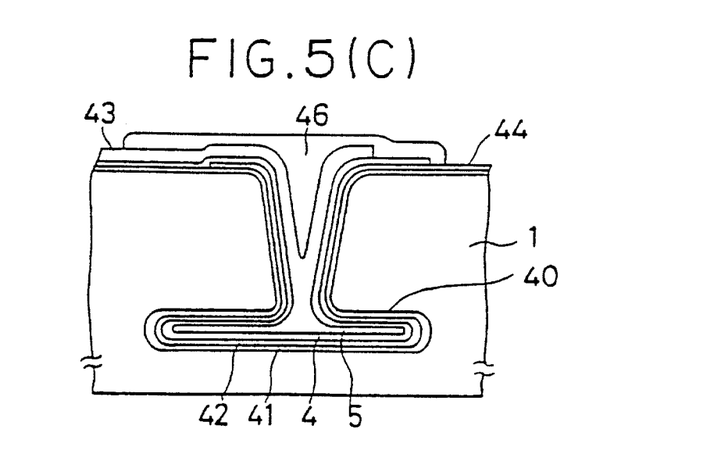

A fourth embodiment of the invention is shown in FIGS. 5(a) to 5(C). The experiment was made to form a semiconductor device in which a cave is formed in a trench to increase the capacitance formed in the trench.

The trench was formed with the depth of 5 micron meters and with the width of 2.5 micron meters at the upper portion and of 1.5 micron meters at the bottom portion, with a silicon nitride layer 2 and a silicon oxide 2' as a mask as shown in FIG. 5(A). Thereafter a silicon nitride layer 45 and 45' was deposited by a CVD method using light irradiation.

Then the silicon nitride layer was let undergo an anisotropic etching to remove selectively the upper layer 45' and the part of the layer 45 formed on the bottom portion 39 of the trench 3. Further, for the substrate 1, an anisotropic etching was carried out to perform a lateral etching so that a cave 40 is formed.

After removing the silicon oxide layer 2' and the silicon nitride layer 2, a silicon oxide layer 41 was deposited on the inside walls of the cave 40, the trench 3 and the surface of the semiconductor substrate 1 according to the method which is the same as that discussed in the preceding. Further on the layer 41 is formed a titanium silicide layer or silicon layer 42 which is doped with phosphorus, an insulating layer 4 such as silicon oxide or silicon nitride and a conductive layer 5 such as a polycrystalline silicon or titanium silicide layer which is doped with phosphorus, each layer being fabricated by a CVD method according to the present invention. Thereafter, a silicon oxide layer 46 was superimposed on the laminate over the trench 3 so as to completely stop the trench. During the process, contacts 44 and 43 were defined by photolithography. Consequently, an improved semiconductor device was obtained with large capacitance.

Figure 6:
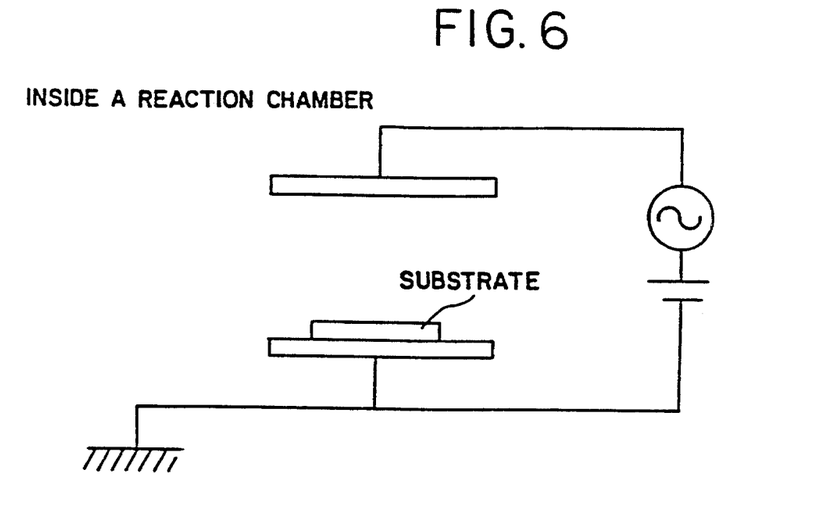
FIG. 6 is a schematic view illustrating a reaction chamber usable in the present invention.

The etching process illustrated in FIGS. 5(A) and 5(B) will be explained with reference to FIG. 6, Inside a reaction chamber, a substrate to be etched is disposed between a pair of electrodes As an etchant gas, $CF_4$, $CF_3Br$, $CCl_4i$ or the like is inputted to the reaction chamber at a negative pressure. An alternating voltage, biased if necessary, is applied to the pair of electrodes to initiate discharge in between, whereupon a chemical vapor reaction takes place. Then, the chemical vapor reaction generates a plasma gas in the reaction chamber by virtue of the energy of the discharge. Under the alternating electric field induced by the applied voltage, the plasma particles reciprocate (resonate) in vertical particles reciprocate (resonate) in a vertical direction between the electrodes, and collide with the horizontal surface of the substrate perpendicularly to the direction of the electric field in the vicinity of the substrate. This etching process is called RIE (Reaction Ion Etching).

The film 2 somewhat hides the side wall of the case 3. The reason why the side wall is partially removed adjacent to the bottom of the case 3 is that the side wall is slightly inclined and therefore not perfectly free from etching, that the anisotropy of RIE is not perfect, and that the effect of the hiding by the film 2 is lessened as departing from the film 2.

The direction of anisotropy etching depends on the crystal orientation, having planes designated conventionally as (110) and (111), and the etchant. Some etchant attacks on the (111) planes at a low rate as compared with the other planes, while another etchant attacks on the plane (110) at a high rate as compared with the other planes.

Figures 7A, 7B:
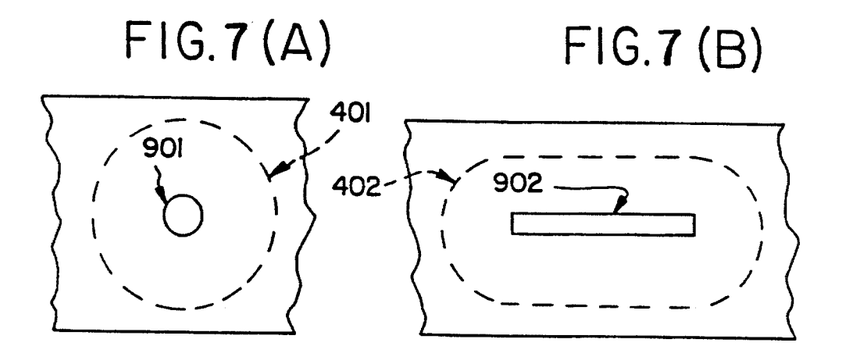
Figure 7C:
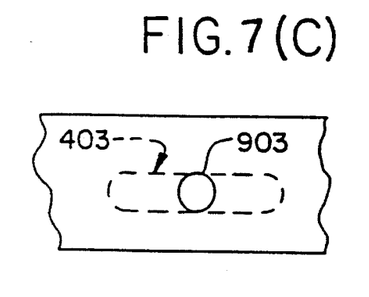
Figure 7D:
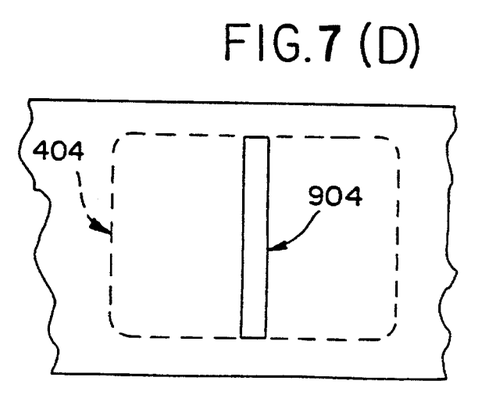

Speaking about FIG. 5(C), the cave is desirably formed, in order to increase the inner surface area, like the low portion of a wine-glass as illustrated in FIGS. 7(A) and 7(B) where the bottom of the wine glass is shown at 401 in FIG. 7(A) and at 402 in FIG. 7(B) and where the entry into the cave is shown at 901 in FIG. 7(A) and 902 in FIG. 7(B). Of course, the lower profile of the cave may be elongated only in one horizontal direction as shown in the sketches 7(C) and 7(D)shown at 403 in FIG. 7(C) and 404 in FIG. 7(D) and the entry into the cave is shown at 903 in FIG. 7(C) and 904 in FIG. 7(D), by appropriately choosing the orientation of the crystal and the etchant. Anisotropic etching itself is well-known in the art.

Referring to FIGS. 8(A) to 8(E), a method for making interconnections between an electrode pattern of a lower level and another electrode pattern of a higher level is described.

Figure 8A:
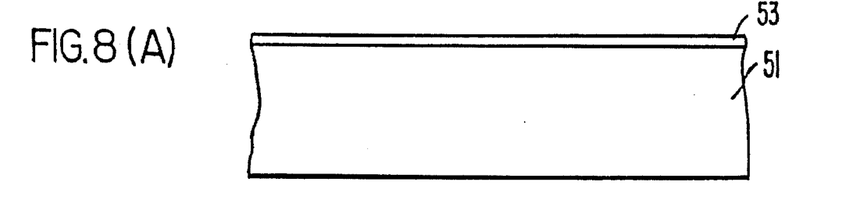
FIGS. 8(A), 8(B), 8(C), 8(D) and 8(E) are fragmentary sectional views showing a further embodiment of the invention.
Figure 8B:
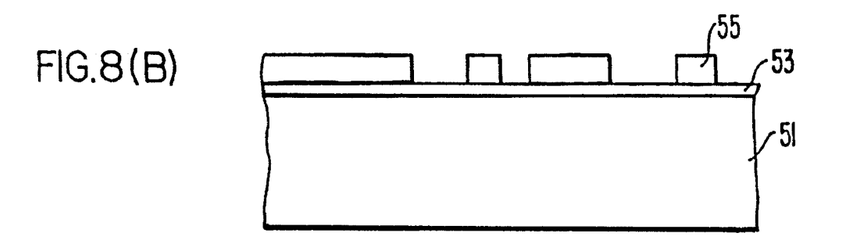

A silicon semiconductor substrate 51 is covered with an upper silicon oxide film 53 for ed by CVD, for example, as illustrated in FIG. 8(A). Semiconductor devices may be fabricated within the substrate such as FET's or Bi-CMOS's. An aluminum film is formed to a thickness of 2 microns, for example, and patterned by known photolithographic techniques to produce a first electrode pattern 55 on the silicon oxide film 53 (FIG. 8(B)). The spacing between the constituent electrode strips of the pattern 55 can be as narrow as 1 micron. An insulating film of silicon nitride is deposited over the pattern in the same manner as the foregoing embodiments, completely filling the intervals between the strips of the pattern. The thickness of the insulating film 57 is typically about 2 microns. The depressions (between electrode strips 55 in this embodiment) can be sufficiently filled with silicon nitride, for example, even when the width of the depressions is less than the depth thereof.

Figure 8C:
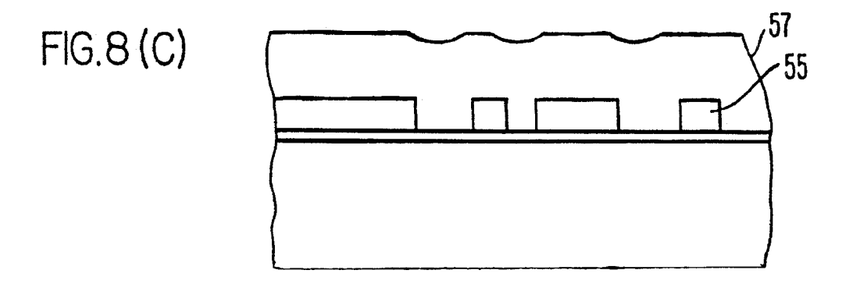
Figure 8D:
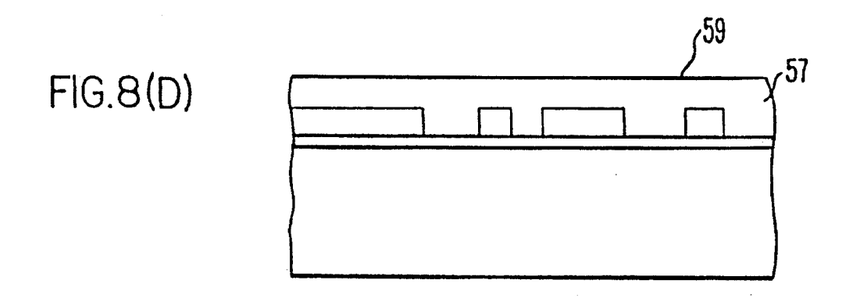
Figure 8E:
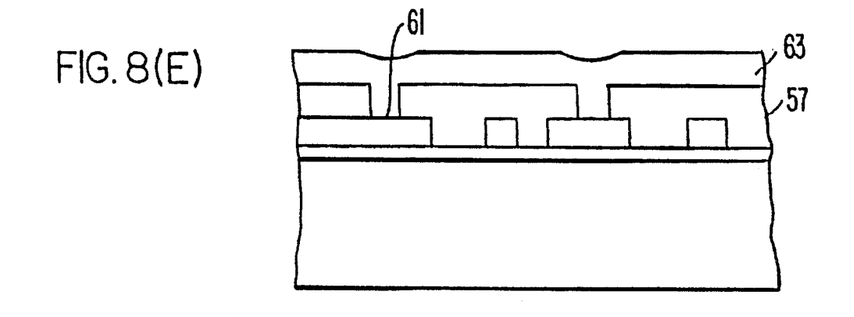

In accordance with the present invention, the upper surface 59 of the insulating film 57 is made flat by isotropic e chin g with an etchant of $NF_3$, for example. With a suitable mask, through-holes 61 are opened in silicon nitride film 57 by etching. A second electrode pattern 63 is formed from an aluminum film on flat surface 59 of silicon nitride film 57 in the same manner as the first electrode pattern, while making contact with the first electrode through the openings 61. Due to the isotropic etch, contact between the first and second electrode patterns is effected.

While the present invention has been described with reference to several preferred embodiments thereof, many variations and modifications will now occur to those skilled in the art. The scope of the present application is limited solely by the scope of the appended claims and not by the specific embodiments disclosed herein.

What is claimed is:

1. A method of forming a depression or a cave structure in a top surface comprising:

forming at least one depression or a cave in said top surface where at least a portion of the depression or the cave has an inner surface;

providing a reactive precursor containing at least an alkyl metal compound; and

CVD forming from a gas of said reactive precursor at least one metal-containing layer over said top surface and said depression or cave such that the ratio ds/dt of the thickness (ds) of the layer on the inner surface of the depression or cave and the thickness (dt) of the layer on the top surface is substantially one.

2. A method as in claim 1 where said layer comprises a metal or a metal silicide.

3. A method as in claim 1 where atoms or molecules of said gas migrate over said top surface and depression during the CVD forming step.

4. A method as in claim 1 wherein a plurality of layers are formed in order to completely fill the depression.

5. A method as in claim 1 where said depression is a trench.

6. A method of forming a depression or a cave structure in a top surface comprising:

forming at least one depression or a cave in said top surface where at least a portion of the depression or the cave has an inner surface;

providing a reactive precursor containing at least an alkyl metal compound; and

CVD forming from a gas of said reactive precursor a plurality of metal-containing layers over said top surface and said depression such that the ratio ds/dt of the thickness (ds) of each layer over the inner surface of the depression and the thickness (dt) of each layer over the top surface is substantially one.

7. A method as in claim 6 where said plurality of layers completely fill the depression.

8. A method as in claim 6 where said layers are selected from the group consisting of a metal and a metal silicide.

9. A method as in claim 6 where said layers are selected from the group consisting of titanium nitride and tungsten.

10. A method as in claim 6 where atoms or molecules of said gas migrate over said top surface and depression during the CVD forming step.

11. A method as in claim 6 where said depression is a trench.

12. A method of forming a depression or cave structure in a top surface comprising:

forming at least one depression or cave in said top surface where at least a portion of the depression or cave has an inner surface;

providing a reactive precursor containing at least an alkyl metal compound; and

CVD forming from a gas of said reactive precursor at least one metal-containing layer over said top surface and said depression or cave such that the ratio ds/dt of the thickness (ds) of the layer on the inner surface of the depression or cave and the thickness (dt) of the layer on the top surface is substantially one and where the layer includes a concavity disposed over the depression; and etching the layer to lessen the amount of said concavity and thus smooth the layer.

13. A method as in claim 12 where said etching is isotropic etching.

14. A method as in claim 12 where said plurality of layers completely fill the depression.

15. A method as in claim 12 where atoms or molecules of said gas migrate over said top surface and depression during the CVD forming step.

16. A method as in claim 12 where said layer comprises a metal or a metal silicide.

17. A method as in claim 12 where said depression is a trench.

* * * * *